United States Patent [19]

Montoya et al.

[11] Patent Number: 5,656,943

[45] Date of Patent: Aug. 12, 1997

[54] APPARATUS FOR FORMING A TEST STACK FOR SEMICONDUCTOR WAFER PROBING AND METHOD FOR USING THE SAME

[75] Inventors: Thomas T. Montoya; K. David Woodliff, both of Austin, Tex.

[73] Assignee: Motorola, Inc., Schaumburg, Ill.

[21] Appl. No.: 550,477

[22] Filed: Oct. 30, 1995

[51] Int. Cl.⁶ .................................................. G01R 31/02
[52] U.S. Cl. .......................... 324/754; 324/761; 324/765
[58] Field of Search ............................ 324/158.1, 72.5, 324/754, 755, 761, 149, 765; 439/482, 824; 437/8

[56] References Cited

U.S. PATENT DOCUMENTS

| | | | |
|---|---|---|---|
| 3,866,119 | 2/1975 | Ardezzone et al. | 324/158 |
| 4,733,172 | 3/1988 | Smolley | 324/754 |
| 5,172,053 | 12/1992 | Itoyama | 324/158 |
| 5,220,279 | 6/1993 | Nagasawa | 324/158 |
| 5,517,126 | 5/1996 | Yamaguchi | 324/754 |
| 5,530,371 | 6/1996 | Perry et al. | 324/754 |

*Primary Examiner*—Vinh P. Nguyen

[57] ABSTRACT

A semiconductor wafer to be tested is placed inside a prober. A probe card (20') is placed inside a specially designed cavity (32) of a prober interface plate (24) that is pre-mounted superjacent to a head plate of the prober. The bottom surface (34) of the cavity provides solid and uniform support for the probe card. The probe card can be lifted out of the cavity whenever a probe card changeover is required. A tester interface plate (60) is pre-mounted to a test head. The tester interface plate has interlocking alignment pins (68 & 68') which are self-aligned into mating chamfered alignment holes (40 & 40') in the prober interface plate. Additionally, these two interface plates have mating interlocking features (46 & 70) for increased stability. The test stack allows the probe card to contact, typically through cantilevered pins; the active surface of the semiconductor wafer, and electrical probing or testing may then be performed on the semiconductor wafer.

20 Claims, 5 Drawing Sheets

APPARATUS FOR FORMING A TEST STACK FOR SEMICONDUCTOR WAFER PROBING AND METHOD FOR USING THE SAME

CROSS-REFERENCE TO RELATED APPLICATION

Related material is disclosed in a commonly-owned co-pending patent application entitled, "Apparatus for Holding a Testing Substrate in a Semiconductor Wafer Tester and Method for Using the Same," by Richard S. Bradshaw et al., attorney docket number SC02893A, filed on Sep. 29, 1995, and assigned to the assignee hereof.

1. Field of the Invention

The present invention generally relates to semiconductor testing, and more specifically to an apparatus for holding a probe card in a semiconductor wafer tester and a method for its use.

2. Background of the Invention

Semiconductor wafers are currently tested in specialized testing equipment to ensure functionality. In this testing equipment, a probe card provides the communication link between the tester and the individual circuitry on the semiconductor wafers. Specific probe cards work with specific types of circuitries on the semiconductor wafers. Therefore, a change in the type of semiconductor wafer being tested, such as from a microprocessor wafer to a memory wafer, requires a corresponding change in the probe card.

Figure 1:
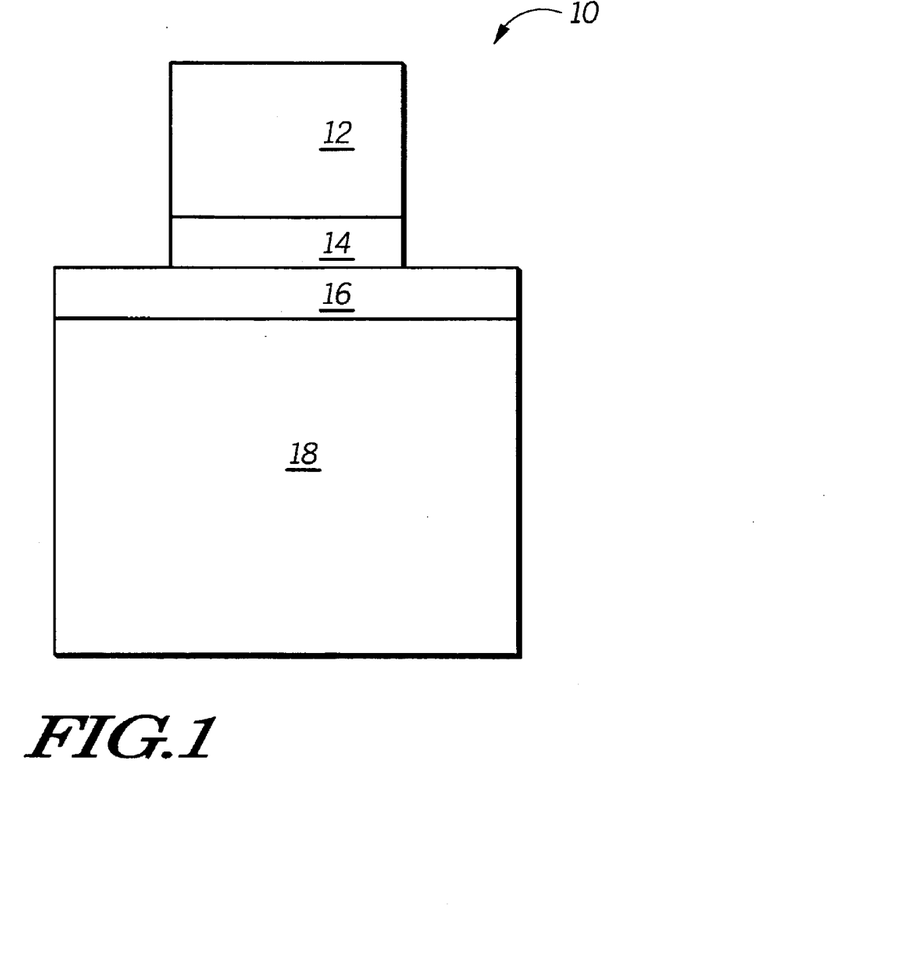
FIG. 1 illustrates a schematic of a test stack composed of a prober, its head plate, an interface, and a test head.
Figure 2:
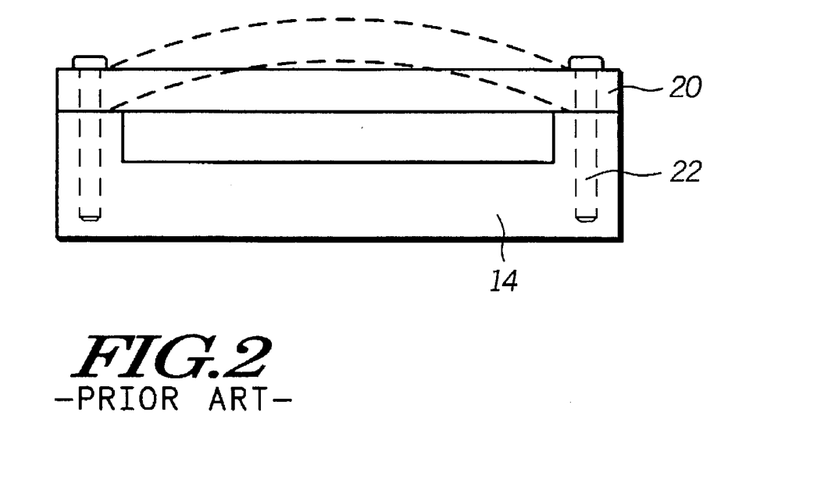
FIG. 2 illustrates, in cross-section, a probe card mounted to an insert as known in the prior art, and the warpage problem associated with such mounting means.

For ease of understanding, FIG. 1 illustrates a simplified depiction of a tester interface stack 10. The tester interface stack is composed of a test head 12 which mates to a ring carrier or insert 14 which is mounted to a head plate 16 on a prober 18. The ring insert 14, which holds the probe card 20 (as shown in FIG. 2), is affixed to the head plate with screws. The probe card 20 is also mounted to the ring insert with screws 22. A problem with this method of mounting the probe card is that warpage can occur with thermal expansion of the probe card (as illustrated by the dashed lines). An additional problem stems from the pogo pins used to make electrical contact to the probe card. The pogo pins require a certain amount of compression in order to make electrical contact. The ring insert has a dead stop such that when the probe card is screwed into place, it comes to a dead stop at a correct height to achieve the correct amount of compression on the pogo pins for making electrical contact. However, these pogo pins are non-linear so that as more compressive force is applied, the compression ratio increases non-linearly which means that the pins are exerting a tremendous amount of pressure against the probe card which could cause it to warp or buckle due to its being restrained in localized areas with screws.

In addition to the warpage problems, this method of mounting the probe card is highly inefficient and has many other shortcomings. The screws used to mount the probe card to the ring insert often become stripped leaving metal shavings inside the testing equipment, which is an undesirable effect. Furthermore, replacement screws are required. Additionally, it is troublesome for a human operator to screw and/or unscrew multiple screws, because these screws are small and are often dropped during the probe card changing process. When a screw is dropped inside the equipment, a technician is required to get inside the machine to locate and remove the dropped screws. Otherwise, use of the testing equipment could lead to more serious damage to the machine.

Yet another problem with the present probe card mounting system is that on the top surface of the ring insert are multiple male sockets with pins which plug into the test head. However, precisely aligning the test head to this ring insert with its multiple male sockets is very difficult. It is easy to damage the pins in the male sockets. A damaged socket, however, cannot be repaired but must be replaced which in itself is a time consuming and labor intensive task.

Thus, a need exists for a simple and efficient way to change the probe card without encountering any of the above-mentioned problems.

DETAILED DESCRIPTION OF A PREFERRED EMBODIMENT

Generally, an embodiment of the present invention allows for a quick and easy changeover of a testing substrate within semiconductor wafer testing equipment. The testing equipment set-up essentially comprises a prober, a test head, and a tester. A semiconductor wafer is placed inside the prober. A probe card is placed inside a specially designed cavity of a prober interface plate that is pre-mounted superjacent to a head plate of the prober. In this manner, the probe card can simply be lifted out of the cavity whenever a probe card changeover is required. A tester interface plate is pre-mounted to the test head. The tester interface plate has interlocking alignment pins which are self-guided into mating alignment holes in the prober interface plate. Additionally, these two interface plates have mating interlocking features for increased stability. The test stack allows the testing substrate to contact, typically through cantilevered pins, the active surface of the semiconductor wafer, and electrical probing or testing may then be performed to determine the functionality of the individual circuitries on the semiconductor wafer.

These and other features, and advantages, will be more clearly understood from the following detailed description taken in conjunction with the accompanying drawings. It is important to point out that the illustrations are simplified, may not necessarily be drawn to scale, and that there may be other embodiments of the present invention which are not specifically illustrated.

In the following discussions on the various elements of the invention, it may be useful to refer to FIG. 6 from time to time to better understand how the prober interface plate of FIG. 3 and the tester interface plate of FIG. 5 fit together to form an apparatus for holding a probe card in accordance with the present invention.

Figure 3:
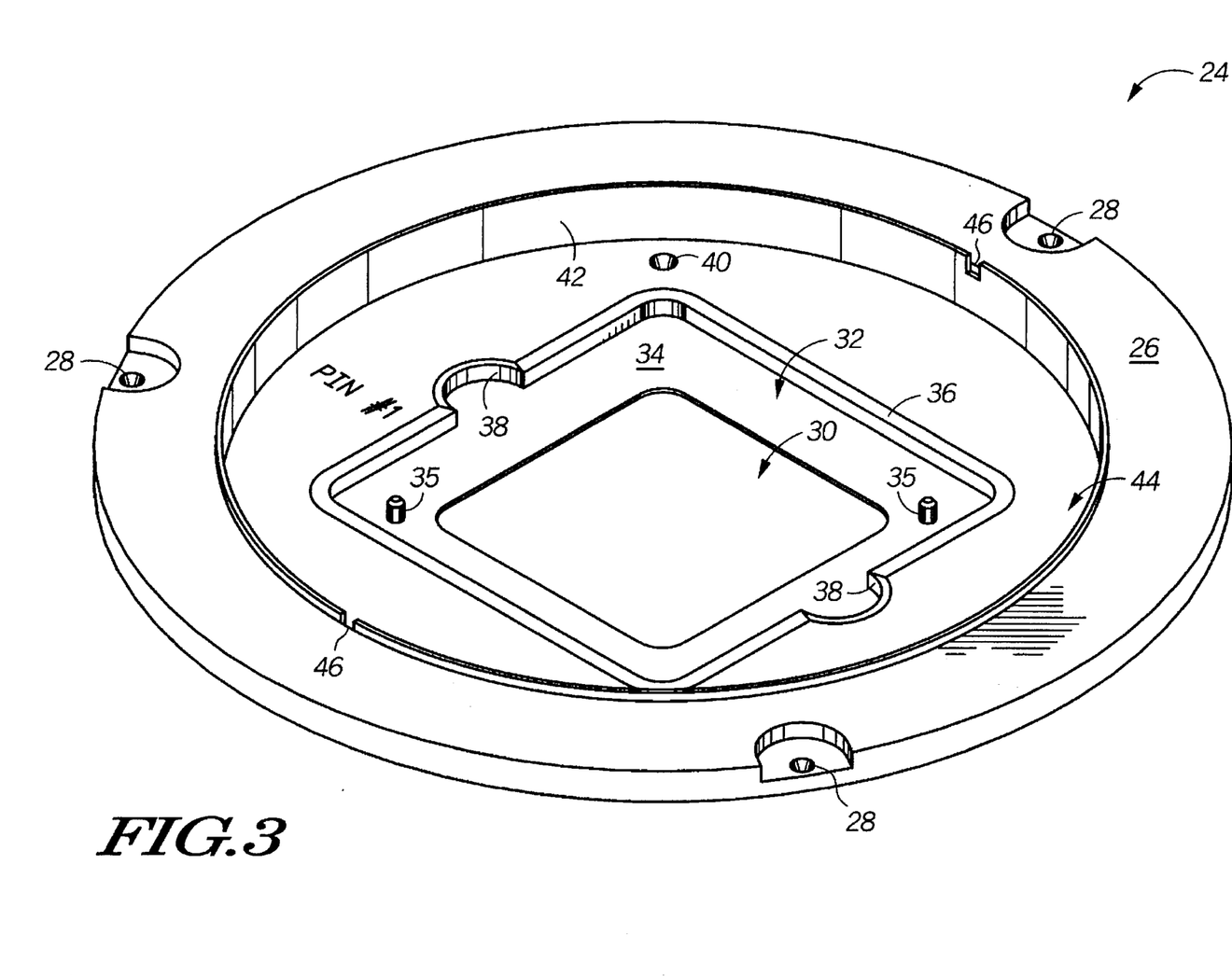
FIG. 3 illustrates, in a perspective view, a prober interface plate in a first embodiment of the present invention.

FIG. 3 illustrates, in a perspective view, a prober interface plate 24 in a first embodiment of the present invention. The prober interface plate 24 is preferably composed of stainless steel for durability. Prober interface plate 24 has a carrier rim 26 for handling. In the carrier rim 26 are holes 28 which are located to match to holes on the head plate of a prober (not shown) so that the prober interface plate 24 can be pre-mounted to the head plate (not shown). Although not limited to any particular dimensions, physical dimensions of a prober interface plate as reduced to practice is approximately 20.5"×25.5"×1.56" (52 cm×65 cm×4 cm). In the center of the prober interface plate 24 is an aperture 30 which is of the same shape as the shape of a probe card (not shown). The central aperture 30 is present so that probe needles (not shown) can contact the semiconductor wafer (not shown) that would be supported inside the prober for testing purposes.

Also shown in FIG. 3 is a cavity 32 which is designed to cradle a probe card of approximately the same size as the cavity 32. The cavity 32 is rectangular in shape, which is the typical shape of probe cards for use with a Terradyne tester. The cavity bottom 34 provides solid and uniform support for the probe card for several important functions. First, by having a solid support under the probe card during testing, any movement of the probe card due to thermal expansion or contraction at the testing temperature is eliminated. The probe card is restrained from movement, which ensures coplanarity of the pogo pins contacting the probe card. Additionally, the probe needles connected to the probe card retain a high degree of coplanarity with the semiconductor wafer or device under test which is located below the probe card.

Disposed on the cavity bottom 34 are locating pins 35 which are placed in particular locations to correspond to corresponding alignment holes in the probe card. No screws are required. This method of support for the probe card is superior to the prior art method, where the probe card was screwed into the dead stops of the ring insert, because eliminating screws simplifies the process of installing new probe cards as well as eliminates torque on the probe card. The sidewall 36 of the cavity 32 is beveled for self-alignment of the pogo pin assembly (illustrated in FIG. 6) when the two interface plates mate. FIG. 3 also depicts cut-outs 38 in the sidewall 36 of the cavity 32. While not required to practice the present invention, the cut-outs 38 do facilitate the removal of probe cards from the cavity by allowing an operator's fingers to easily reach an edge of the probe card to lift it out of the cavity.

It is important to note that an advantage of the present invention is that the prober interface plate 24 can be pre-mounted to the head plate of the prober. Once mounted, the prober interface plate need not be removed every time a probe card changeover is required because the probe card can simply be lifted out of the cavity and changed. There is no need to unscrew the prober interface plate with the present probe card mounting method, unlike the ring insert of the prior art which required a complete disassemblement of the test stack every time a probe card changeover was needed.

Again with reference to FIG. 3, an alignment hole 40 is disposed on the upper surface of the prober interface plate 24 outside of the cavity 32. A preferred embodiment has two alignment holes of different sizes so that orientation of the tester interface plate (discussed in conjunction with FIG. 5) is fixed to a unique position. Alignment hole 40 is chamfered at the top to provide a lead-in to the mating interlocking alignment pin (see FIG. 5). Although FIG. 3 depicts the location of the alignment hole 40 near a corner of the cavity, one is not limited to this particular location. Instead, alignment holes can be placed wherever there is room and deemed most convenient.

Another important feature of the prober interface plate 24 is a sidewall ring 42 that encompasses the cavity 32 and the alignment hole 40. This sidewall ring 42 forms a second cavity 44. The tester interface plate 60 of FIG. 5 mates to the prober interface plate 24 by fitting inside this second cavity 44. Formed into the sidewall ring 42 are keyholes 46 which are used to lock the tester interface plate 60 into place against the prober interface plate 24. The utility of these features will become more apparent with subsequent discussion.

Figure 4:
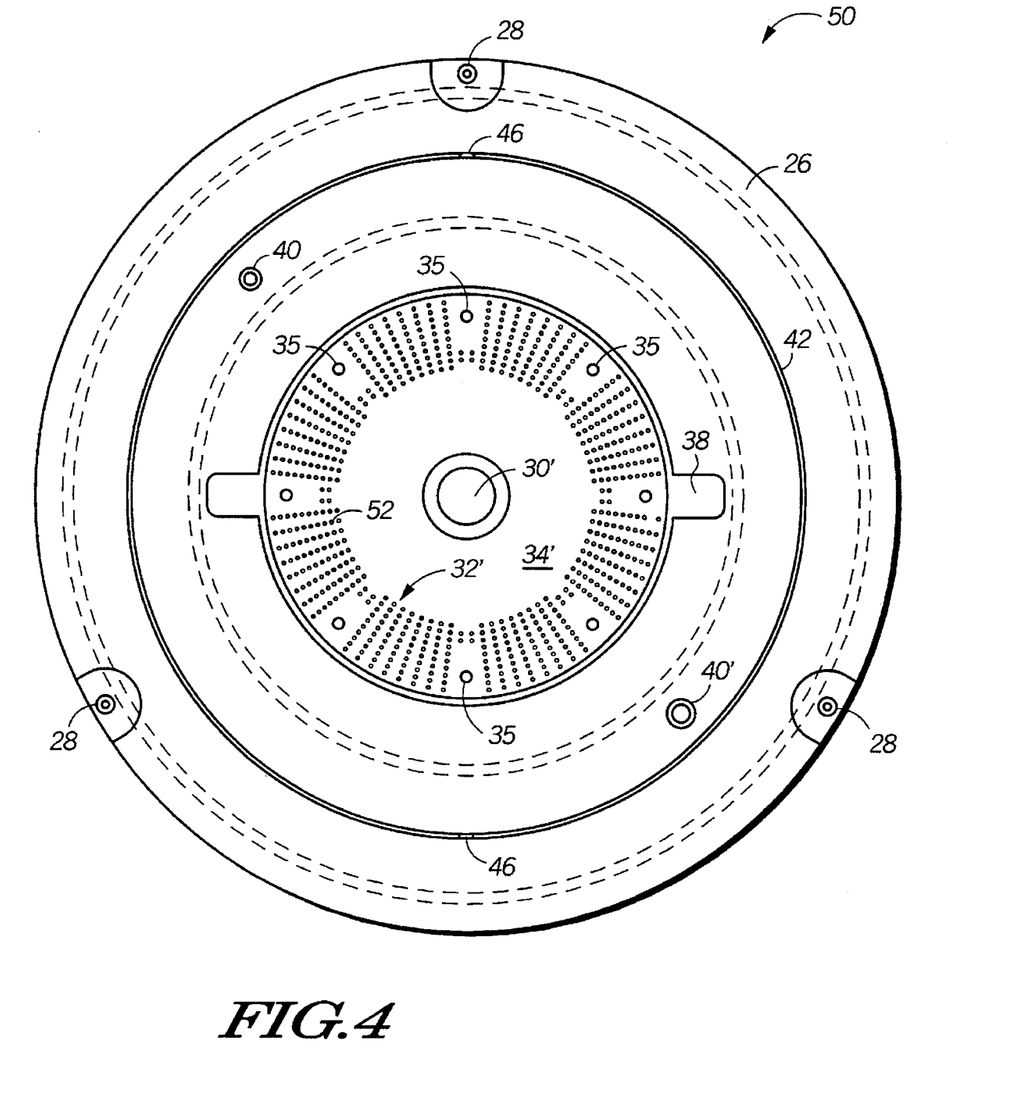
FIG. 4 illustrates, in a top view, another prober interface plate in a second embodiment of the present invention.

FIG. 4 illustrates, in a top view, another prober interface plate 50 in a second embodiment of the present invention. This second embodiment is substantially similar to the first embodiment shown in FIG. 3, except that the cavity 32' is circular instead of rectangular to accommodate round probe cards. Round probe cards are typical for use with Adventest testers. As can be seen in this figure, the alignment holes 40 and 40' are of different sizes to ensure a unique and correct orientation of the mating tester interface plate. Additionally, it should be noted that multiple locating pins 35 inside the cavity 32' can be placed to correspond to the location of alignment holes in the probe card which were used in the prior art for screwing the probe card down to the insert ring as previously discussed. It is possible to locate the locating pins in an asymmetric manner to ensure a unique and correct alignment of the probe card every time it is placed inside the cavity by the operator. This feature helps to eliminate operator error in installing a different probe card by making the alignment automatic.

Also illustrated in FIG. 4 is the pogo pin area 52. Once the probe card is placed inside the cavity and the mating tester interface plate is interlocked with the prober interface plate, the pogo pins which provide the electrical contact between the test head and the probe card would contact the probe card in this pogo pin area. The thickness of the cavity bottom is designed to a specific thickness to guarantee a correct compression of the pogo pins for achieving electrical contact. As mentioned previously, an advantage to having a solid and planar support surface for the probe card in the pogo pin area is that the compressive force exerted by the pogo pins is evenly distributed across the cavity bottom without any localized stress points so that a torque is not applied to the probe card to cause warpage.

Figure 5:
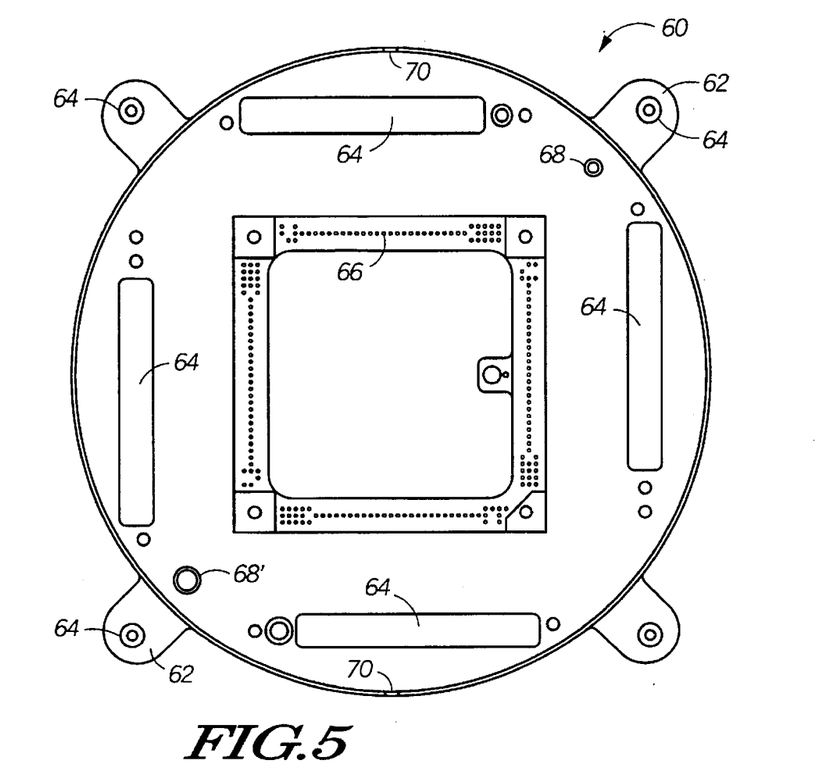
FIG. 5 illustrates, in a bottom view, a tester interface plate which mates to the prober interface plate of FIG. 3.

FIG. 5 illustrates, in a bottom view, a tester interface plate 60 which mates to the prober interface plate 24 of FIG. 3. The tester interface plate 60 is designed to fit into the cavity 44 of FIG. 3 once the two interface plates are mated and interlocked. Anodized aluminum is the preferred material for the tester interface plate 60 because that material is lightweight as compared to stainless steel. Weight is a consideration because this tester interface plate is mounted to a test head and would actually rest on top of the prober interface plate, and hence the probe card held inside the prober interface plate. Shown in FIG. 5 are handles or ears 62 located at the outside edge of the tester interface plate 60. Located in each handle 62 is a screw hole for mounting the tester interface plate 60 to the test head. As will become more apparent in the discussion belows the tester interface plate can be pre-mounted onto the test head, such that once mounted, the tester interface plate remains attached to the test head even when probe cards are changed as long as prober interface plate remains the same. This presents an advantage over the prior method because the risk of damaging the male sockets is completely eliminated since the present method does not require a re-alignment of these male sockets with the test head every time the test stack is partially disassembled for a probe card change.

FIG. 5 also illustrates a plurality of socket holes 64 located at the periphery of the tester interface plate 60. Electrical male sockets (shown in FIG. 6) are soldered inside these socket holes 64, where the male sockets would plug into mating female sockets in the test head for electrical connection. These male sockets were a part of the ring insert in the prior art method which then had to be precisely aligned and mated to the test head with every probe card changeover. An advantage of the present method where the male sockets are now placed inside the tester interface plate is that the alignment is only done with the initial mounting of the tester interface plate onto the test head. Once mounted, it is not removed with every probe card changeover, because the tester interface plate can be disengaged from the prober interface plate for removing the probe card. In this manner, the risk of damaging socket pins is greatly mitigated.

The tester interface plate 60 has alignment pins 68 and 68' which extend outwardly at approximately right angles to the bottom surface of the tester interface plate 60. These alignment pins align to and fit inside the alignment holes 40 and 40' in the prober interface plate. Recalling that the alignment holes are chamfered at the top, these alignment pins have a lead-in to the alignment holes, in essence a rough self-alignment, even if the two interface plates are not precisely aligned with respect to each other prior to being mated. Furthermore, the-tester interface plate 60 has lock buttons 70 located at the edge of the plate 60 which are designed to fit into the keyholes 46 in the sidewall ring 42 of the prober interface plate 24. These lock buttons once properly engaged securely interlock the two interface plates together so that the probe card is restrained from movement inside the cavity of the prober interface plate.

Also on the bottom surface of the tester interface plate 60 is a pogo pin assembly area 66 which corresponds to the cavity 34 of FIG. 3. As mentioned previously, once the two interface plates are mated together, the pogo pins 67 which are attached to a printed circuit board assembly 80 mounted to the bottom surface of the tester interface plate 60 are compressed against the probe card to achieve electrical contact for testing purposes. This aspect can clearly be seen in FIG. 6 which is an exploded cross-sectional view of the stacking of the prober interface plate, the probe card, the printed circuit board assembly with pogo pins, and the tester interface plate. It should be understood that the prober interface plate would be mounted superjacent to a head plate of a prober (not shown) and that the tester interface plate would be mounted subjacent to a test head (not shown). Both the prober and test head are known equipment in the art.

It should be appreciated that by simply requiring the operator to drop in the probe card using the locating pins in the cavity provided in the prober interface plate 24 and simply guiding the test head with the tester interface plate already attached over the prober interface plate and using the alignment pins in the tester interface plate to re-engage the two interface plate to form the test stack, changing out probe cards for different semiconductor wafer types is greatly simplified with the present invention. Moreover, since the screws have been eliminated, the problem of machine down time caused by dropped screws is also eliminated. Furthermore, there is no longer the problem of stripped screws leaving metal shavings inside the equipment or on the semiconductor wafer surface, and no replacement screws are required. Additionally, the problem of broken pins in the male sockets which must mate to female sockets in the test head is also eliminated because the tester interface plate is pre-mounted to the test head.

In a method of testing a semiconductor wafer using the apparatus of the present invention, the semiconductor wafer to be tested is placed inside the prober on a support chuck or the like. The head plate of the prober already has the prober interface plate pre-mounted thereon. An appropriate probe card for the given semiconductor wafer is placed inside the cavity of the prober interface plate using the locating pins to ensure correct placement of the probe card. The test head has the tester interface plate pre-mounted thereon. The operator then re-aligns the tester interface plate with the prober interface plate using the alignment pins and holes provided on each plate. Once the alignment pins on the tester interface plate are inserted into the alignment holes in the prober interface plate, the lock buttons on the tester interface plate are engaged into the keyholes in the prober interface plate to secure the probe card in place. The test stack is then complete and the appropriate electrical test can be run to determine the functionality of the individual devices on the semiconductor wafer. The test stack according to the present invention comprises the test head, the tester interface plate, the prober interface plate, and the prober.

Figure 6:
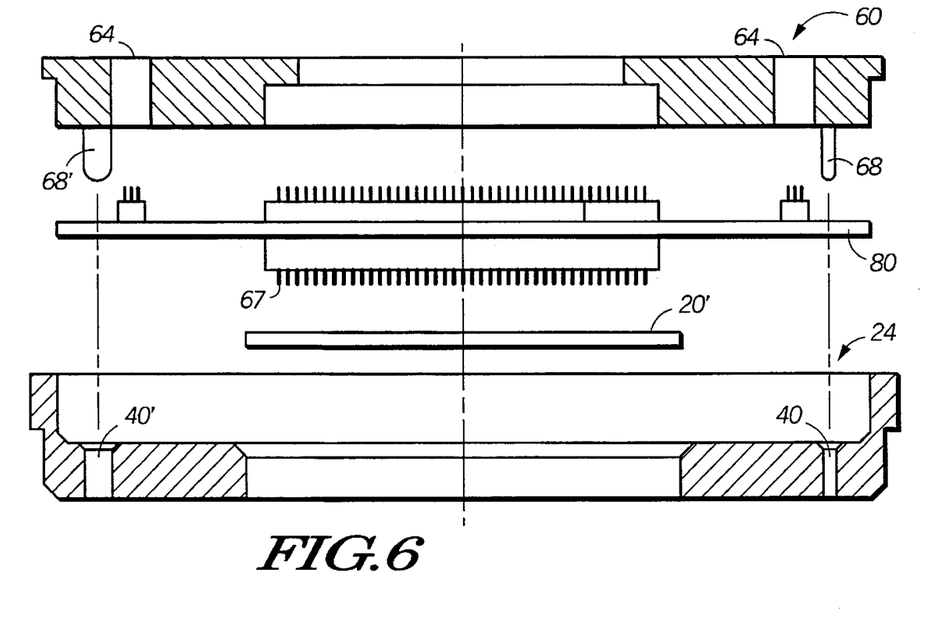
FIG. 6 illustrates, in an exploded cross-sectional view, the stacking of the tester interface plate to the prober interface plate to securely hold the probe card in place, in accordance with the invention.
Figure 7:
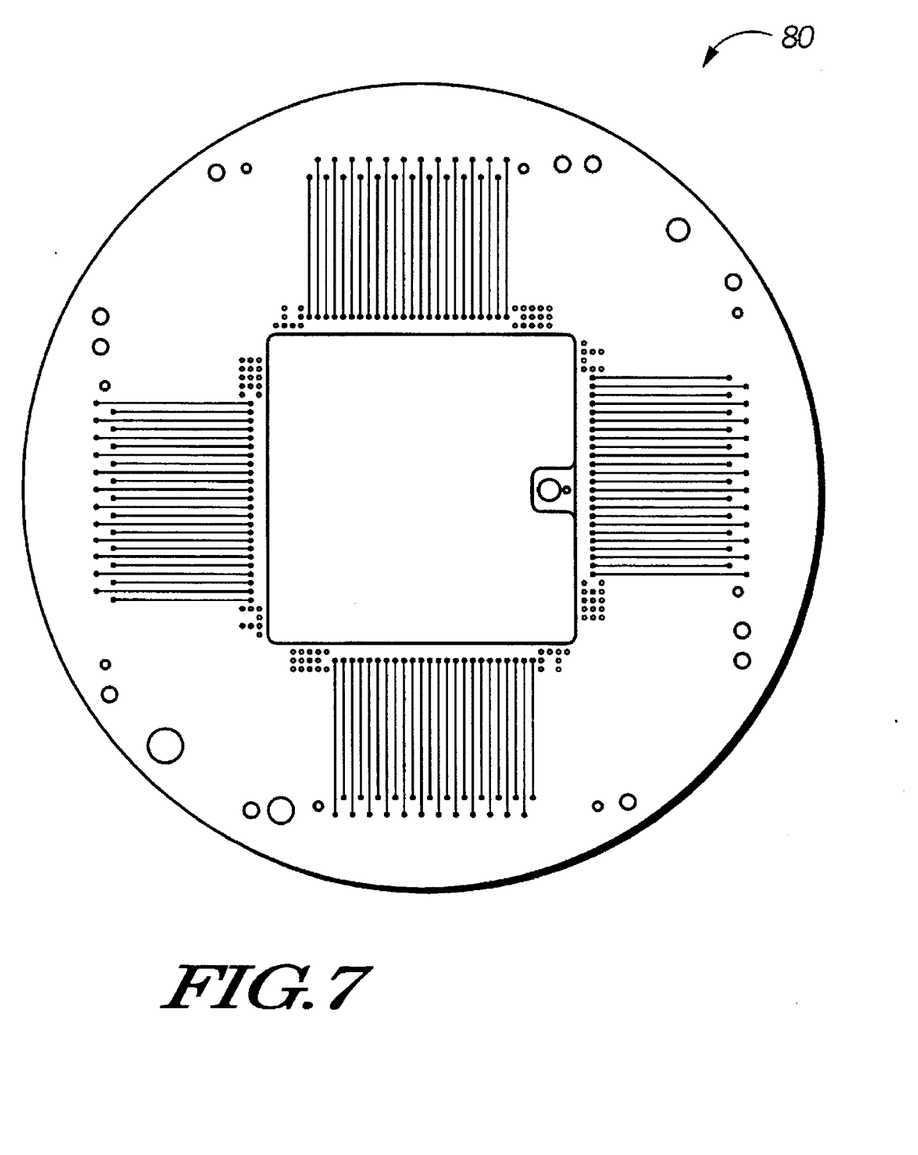
FIG. 7 illustrates, in a bottom view, the printed circuit board assembly of FIG. 6 without the pogo pin assembly.

FIG. 7 illustrates, in a bottom view, the printed circuit board assembly 80 of FIG. 6 without the pogo pin assembly. The printed circuit board assembly has conductive traces thereon-which are routed to the pogo pins (shown in FIG. 6) to send electrical signals from the test head to the probe card and ultimately to the underlying device under test or semiconductor wafer. The exact configuration of this printed circuit board assembly is not critical to the present invention. It is sufficient to note that for current testing methods, a printed circuit board assembly is needed within the test stack.

The foregoing description and illustrations contained herein demonstrate many of the advantages associated with the present invention. In particular, it has been revealed that an apparatus for holding a probe card comprising a plate rotatably hinged to the head stage of the tester allows for a much simpler and quicker changeover of probe cards for testing of different types of semiconductor wafers. The plate is securely latched to the head stage to prevent the pogo pins from forcing the plate to open on one or both sides. An added advantage to practicing the present invention is that the means by which the probe card is held allows for uniform thermal expansion in one plane whereas the prior art method would often cause a warping of the probe card due to thermal expansion. Moreover, the screws used for mounting the probe card as known in the prior art have all been eliminated, thus eliminating all problems associated with or caused by the presence of these screws. Yet another advantage is that the present invention greatly reduces cycle time in the probe card changing process to increase productivity on the test floor.

Thus it is apparent that there has been provided, in accordance with the invention, an apparatus for holding a testing substrate for semiconductor wafer probing or testing that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, although the interface plates have been shown to be circular, they are not limited to the circular shape but can rectangular or any other shape suitable to the geometric constraints of the testing equipment and the probe card itself. Furthermore, the interface plates may be manufactured as single plates having all of the structural elements discussed above, or they can be manufactured as separate pieces each having a portion of the structural elements which can then be fitted together to form a single plate as described above. The manufacturing process may be simplified where the configuration is complex due to the number of ledges and chamfers involved. In addition, the invention is not limited to any particular type of prober or tester but may be implemented on all types of probe or test equipment. It is also important to note that the present invention is not limited in any way to any particular type of semiconductor wafers. The wafers can be microprocessor devices, microcontroller devices, memory devices, bipolar devices, or any other type of devices. Therefore, it is intended that this invention encompasses all such variations and modifications falling within the scope of the appended claims.

We claim:

1. An apparatus for holding a probe card in a semiconductor wafer testing system comprising:
    a tester interface plate having
        a carrier rim containing first means for mounting the tester interface plate to a test head,
        an interlocking alignment pin extending outwardly at approximately a right angle from a prober interface plate mating surface,
        a plurality of socket holes for male electrical sockets which plug into the test head for sending and receiving electrical signals from the test head, and a defined area for a pogo pin assembly; and
    a prober interface plate having
        a first cavity, the first cavity having a support surface for holding the probe card,
        a locating pin disposed on the support surface of the first cavity for alignment of the probe card,
        an alignment hole outside the first cavity for mating to the tester interface plate, wherein the interlocking alignment pin on the tester interface plate is positioned to fit into the alignment hole to interlock the tester interface and the prober interface plates,
        a sidewall ring having a height, said sidewall ring enclosing the first cavity and the alignment hole, to form a second cavity wherein a portion of the tester interface plate lies within the second cavity when the tester interface plate is mated to the prober interface plate; and
        a carrier rim containing second means for mounting the prober interface plate to a prober.

2. The apparatus of claim 1, wherein the prober interface plate has a cut-out located at a side of the first cavity for removing the probe card by its edge from the first cavity.

3. The apparatus of claim 1, wherein the alignment hole outside the first cavity in the prober interface plate is chamfered so that the mating interlocking alignment pin on the tester interface plate has a lead-in for alignment purposes.

4. The apparatus of claim 1, wherein the first cavity in the prober interface plate has a chamfered sidewall for alignment of a printed circuit board assembly.

5. The apparatus of claim 1, wherein the prober interface plate is composed of stainless steel.

6. The apparatus of claim 1, wherein the tester interface plate is composed of anodized aluminum.

7. The apparatus of claim 1, wherein the first and second means for mounting include screw holes for screwing the tester interface plate to the test head and for screwing the prober interface plate to the prober.

8. The apparatus of claim 1, wherein the first cavity has a shape selected from a group consisting of rectangular and circular.

9. The apparatus of claim 1, wherein the tester interface plate has a lock button located at a perimeter of the carrier rim of the tester interface plate, and the sidewall ring of the prober interface plate has an interlocking keyhole through a thickness of the sidewall ring for interlocking with the lock button on the tester interface plate.

10. An apparatus for testing a semiconductor wafer, comprising:
    a semiconductor wafer prober;
    a prober interface plate overlying the semiconductor wafer prober and mounted to the semiconductor wafer prober, the prober interface plate having a first cavity and a second cavity formed therein, the first cavity having a support surface and a locating pin, wherein the locating pin lies on the support surface;
    a probe card lying within the first cavity of the prober interface plate and abutting the underlying support surface of the first cavity, wherein the locating pin in the first cavity aligns the probe card;
    a printed circuit board assembly overlying the probe card, the printed circuit board assembly having a plurality of pogo pins;
    a tester interface plate overlying the printed circuit board assembly and the prober interface plate, the tester interface plate having a pogo pin assembly area and a socket area, wherein a portion of the tester interface plate extends into the second cavity of the prober interface plate such that the tester interface plate exerts a uniform force on the underlying probe card and compresses the plurality of pogo pins; and
    a tester having a test head, the test head overlying the tester interface plate and mounted to the tester interface plate.

11. The apparatus of claim 10, wherein the prober interface plate is composed of stainless steel.

12. The apparatus of claim 10, wherein the prober interface plate has a chamfered alignment hole and the tester interface plate has an interlocking alignment pin disposed to fit into the chamfered alignment hole to interlock the prober interface plate and the tester interface plate.

13. The apparatus of claim 10, wherein the tester interface plate is composed of anodized aluminum.

14. The apparatus of claim 10, wherein the tester interface plate has screw holes through a thickness of the tester interface plate so that the tester interface plate can be screwed to the test head of the tester.

15. The apparatus of claim 10, wherein the prober interface plate has screw holes located outside the second cavity so that the prober interface plate can be screwed to the semiconductor wafer prober.

16. The apparatus of claim 10, wherein the tester interface plate has a locking feature located at a periphery of the tester interface plate which mates to a keyhole located in a sidewall ring of the prober interface plate to securely lock the tester interface plate against the prober interface plate such that the probe card is restrained from movement within the first cavity.

17. A method for testing a semiconductor wafer comprising the steps of:
    providing a prober having a prober interface plate mounted to the prober, wherein the prober interface plate has an alignment hole, a first cavity, and a second cavity, the first cavity having a support surface, a locating pin, and a substantially central aperture, wherein the locating pin lies on the support surface;

placing a probe card into the first cavity of the prober interface plate, wherein the probe card abuts the underlying support surface of the first cavity and the locating pin aligns the probe card;

placing a semiconductor wafer having an active die surface into the prober, wherein the active die surface is contactable by the probe card through the substantially central aperture in the first cavity of the prober interface plate;

providing a tester interface plate, the tester interface plate having a printed circuit board assembly mounted thereto, the printed circuit board assembly underlying the tester interface plate and having conductive traces and a plurality of pogo pins thereon to send electrical signals to the probe card, wherein the tester interface plate has an interlocking alignment pin disposed in a location so as to align to the alignment hole in the prober interface plate;

inserting the interlocking alignment pin on the tester interface plate into the alignment hole in the prober interface plate so that the tester interface plate overlies the prober interface plate and a portion of the tester interface plate extends into the second cavity of the prober interface plate and the plurality of pogo pins make electrical contact with the probe card;

forming an electrical contact between the probe card and the active surface of the semiconductor wafer; and performing an electrical test on the semiconductor wafer.

18. The method of claim 17, wherein the step of placing the semiconductor wafer places a wafer containing devices selected from a group consisting of: microprocessor, microcontroller, memory, and bipolar.

19. The method of claim 17, wherein the step of placing the probe card places a card having a shape selected from a group consisting of rectangular and circular.

20. The method of claim 17, further comprising the step of locking the tester interface plate against the prober interface plate by fitting a lock button located at a periphery of the tester interface plate into a keyhole located in a sidewall ring on the prober interface plate.

* * * * *